United States Patent
Ghorpade et al.

(10) Patent No.: US 8,330,537 B1
(45) Date of Patent: Dec. 11, 2012

(54) LOW NOISE, HIGH CMRR AND PSRR INPUT BUFFER

(75) Inventors: Gururaj Ghorpade, Bangalore (IN); Theertham Srinivas, Bangalore (IN); D V J Ravi Kumar, Bangalore (IN); Mehmet Aslan, Sunnyvale, CA (US); K. Krishna Mahesh, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/051,929

(22) Filed: Mar. 18, 2011

Related U.S. Application Data

(60) Provisional application No. 61/367,282, filed on Jul. 23, 2010.

(51) Int. Cl.
*H03F 1/02* (2006.01)
(52) U.S. Cl. .............. 330/9; 330/69; 330/51; 330/253; 330/255; 330/136
(58) Field of Classification Search .............. 330/69, 330/51, 253, 136, 9, 255
See application file for complete search history.

(56) References Cited

U.S. PATENT DOCUMENTS

| | | | | |
|---|---|---|---|---|
| 5,352,938 A * | 10/1994 | Wise et al. | ...................... | 327/72 |
| 5,451,900 A * | 9/1995 | Haga et al. | ...................... | 330/10 |
| 5,715,204 A * | 2/1998 | Barcella | ........................ | 365/208 |
| 6,011,435 A * | 1/2000 | Takeyabu et al. | ............. | 330/252 |
| 6,320,422 B1 | 11/2001 | Koh | | |
| 6,380,801 B1 * | 4/2002 | McCartney | ...................... | 330/9 |
| 6,433,637 B1 | 8/2002 | Sauer | | |
| 6,518,842 B1 | 2/2003 | Carter et al. | | |
| 7,157,970 B2 | 1/2007 | Dawes | | |
| 2005/0270093 A1 * | 12/2005 | Kurokawa | ...................... | 330/10 |

* cited by examiner

*Primary Examiner* — Patricia Nguyen
(74) *Attorney, Agent, or Firm* — Andrew S. Viger; Wade J. Brady, III; Frederick J. Telecky, Jr.

(57) ABSTRACT

A rail-to-rail buffer receiving a differential input signal and generating a differential output signal includes first and second amplifier circuits configured in a pseudo differential buffer structure and first and second comparators coupled to compare the respective part of the differential input signal and a first voltage and to generate select signals. Each of the first and second amplifier circuits includes first and second complementary differential input stages and the first and second comparators generate respective select signals to turn on only one of the first or the second differential input stage in each amplifier circuit depending on a value of the respective part of the differential input signal. In operation, the first and second complementary differential input stages of each amplifier circuit not being turned on at the same time.

25 Claims, 6 Drawing Sheets

LOW NOISE, HIGH CMRR AND PSRR INPUT BUFFER

CROSS-REFERENCE TO RELATED APPLICATION

This application claims the benefit of U.S. Provisional Patent Application Ser. No. 61/367,282, filed on Jul. 23, 2010, of DVJ Ravi Kumara et al., which application is incorporated herein by reference in its entirety.

FIELD OF THE INVENTION

The invention relates to buffers and, in particular, to a rail-to-rail buffer having low noise, high common mode rejection ratio and power supply rejection ratio.

DESCRIPTION OF THE RELATED ART

High resolution ΣΔ Analog-to-digital converters (ADCs) are used in many applications, such as process control, sensor conditioning, instrumentation. Many sensors use resistor based circuits, including strain gages (120Ω-3500Ω), weigh scale load cells (350Ω-3500Ω), pressure sensors (350Ω-3500Ω), relative humidity sensors (100KΩ-10 MΩQ), thermistors (100Ω-10 MΩ) and others. In a CMOS ADC, the analog input from the sensor is connected directly to a switched-capacitor circuit which generates transient currents. Hence, high source impedance at the ADC input can results in gain error. Typically, an input buffer is used at the front-end of the ΣΔ ADC to isolate the sampling capacitor charging current from the analog signal source. In addition, the input buffer also allows the user to place significant source impedances on the analog input, allowing R/C filtering, such as for noise rejection or RF interference reduction, to be placed on the analog inputs, if required. A fundamental requirement of the input buffer is not to degrade the dc or ac (approximately <1 kHz) performance of the analog-to-digital converter. The analog input signal could be a small differential signal on a high common mode or a large differential signal on a mid common mode. To support all the applications, the input buffer needs to support the rail-to-rail input/output common-mode voltage range.

FIG. 1 is a block diagram illustrating a conventional precision sensing system. Referring to FIG. 1, in system 10, a bridge sensor 12 generates an analog input signal being a differential input signal. The differential input signal is to be digitized by a ΣΔ ADC which includes a ΣΔ modulator 16. ΣΔ modulator 16 receives the analog input signal and generates a digital output signal Dout (node 18) indicative of the magnitude of the analog input signal. In the present illustration, the differential input signal can be buffered by an input buffer 14 or left unbuffered by passing through the bypass paths with the switches closed. The differential input signal, buffered or unbuffered, is then applied to the sampling capacitors $C_S$ of the ΣΔ Modulator 16. In the bypass mode, the ADC operates in the unbuffered mode which lowers the power consumption. In the buffered mode, the bypass paths are disabled by opening the switches and the modulator 16 is isolated from the analog signal source (bridge sensor 12). Thus, the user can place source impedances on the sensor output nodes without introducing gain errors to the system. Furthermore, the sampling capacitor charging current is also isolated from the analog input nodes.

In some application, isolation of the sampling capacitor $C_S$ from the analog signal source is required because most ΣΔ modulator design is based on switched capacitor circuits operating in a sample-and-hold mode. The basic structure of a first order integrator including switches and capacitors is shown in FIG. 1. The first integrator has very high impedance in the steady state but requires a charging current every time the switches open and close to charge the sampling capacitor $C_S$ to the input voltage. The magnitude of the charging current depends on the sampling frequency, the differential input voltage, and the capacitor size. If a buffer is not provided as an input stage to the ADC, this dynamic load places restrictions on the maximum values of resistance and capacitance that may be used at the sensor 12. Excessive values of resistance at the sensing circuit can result in ADC gain errors as a result of the input signal not being able to fully charge the input capacitor during the sampling period. The allowable resistance decreases rapidly for higher accuracies, gains, and sampling capacitances. The current drawn is quite stable over temperature, and hence does not directly contribute to gain drifts. However, external components often drift in value over temperature so the voltage dropped across them due to the input current will vary and could result in a significant gain drift. Thus, providing an input to the ADC is typically desired to isolate the sensing circuit from the charging current of the ADC modulator.

In sensor application, the transducer supplies an excitation voltage '$V_{BR}$' to the sensor and a differential voltage is generated, which is a function of the parameter to be sensed or measured, such as pressure or temperature. Though the sensor signal may have weak amplitude, the signal may have common mode voltage near either of the power supply rails. Thus, it is desirable that the input buffer is capable of handling rail to rail input voltages.

Furthermore, selecting a suitable drive amplifier or buffer for the ADC requires attention to input impedance, output accuracy, common mode range, driving capability, and noise reduction. Furthermore, conventional differential-in, differential-out buffer requires closed loop configuration using either resistors or switched capacitors. Using resistors or switched capacitors in the feedback loop of the buffer is undesirable for the same reasons it is undesirable to connect the sensing circuit directly to the switched capacitors of the ADC modulator. In some cases, a pseudo differential buffer structure is used, as shown in FIG. 2. In the pseudo differential buffer 24, separate amplifiers are used to amplify the differential input voltage $V_{INP}$ and $V_{INN}$. Thus, the sensor 12 output nodes drives the input terminal of the amplifiers directly, without being coupled to any switched capacitor or resistor circuitry.

Conventional rail-to-rail buffers are implemented using two complementary differential input pairs. The buffers typically has three regions of operation where both of the differential input pairs are turned on in one of the three regions. Switching between the input pairs can be controlled by controlling the tail current provided to the common mode node. However, the conventional rail-to-rail buffers suffer from poor CMRR (common mode rejection ratio) and PSRR (power supply rejection ratio) during the transition between the input differential pairs, particularly during the transition when both the differential input pairs are turned on.

DETAILED DESCRIPTION OF THE PREFERRED EMBODIMENTS

According to the principles of the present invention, an input buffer receiving a differential input signal and generating a differential output signal includes a pair of amplifiers configured in a pseudo-differential arrangement, each amplifier being implemented using a pair of complementary differential input pairs to realize rail-to-rail common mode input range. In accordance with embodiments of the present invention, each amplifier of the input buffer is operated in a manner so that either the p-type differential pair or the n-type differential pair is activated at a time but not both at the same time. In some embodiments, the selection of the p-type or n-type differential pair is performed by sensing the analog input signal level. Further more, in some embodiments, a hysteretic comparator is used to sense the analog input signal level and to generate the select signal for selecting one of the p-type or n-type differential pair. The input buffer of the present invention is suitable for use as a front-end or an input stage to an analog-to-digital converter (ADC). The input buffer may be used to interface the ADC to sensors to isolate the ADC from the analog signal source.

In conventional input buffer operation, both the n-type and p-type differential pairs are kept on and the input buffer thus suffers from poor common-mode rejection ration (CMRR) and poor power supply rejection ration (PSRR). The input buffer of the present invention avoids the overlapping region during the transition between the n-type differential pair and the p-type differential pair. Accordingly, the input buffer of the present invention realizes rail-to-rail input and output voltage range while achieving high CMRR and high PSRR. In embodiments of the present invention, the input buffer incorporates chopping techniques to achieve rail-to-rail input voltage range without the crossover distortion in the offset voltage when switching between the n-type and p-type differential pairs.

Figure 1:
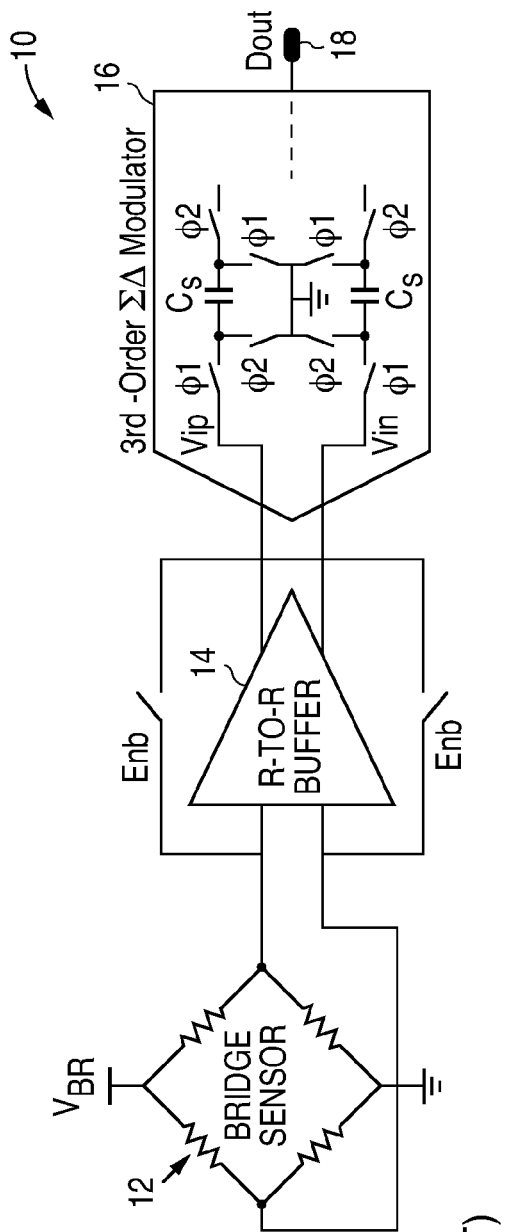
FIG. 1 is a block diagram illustrating a conventional precision sensing system.
Figure 2:
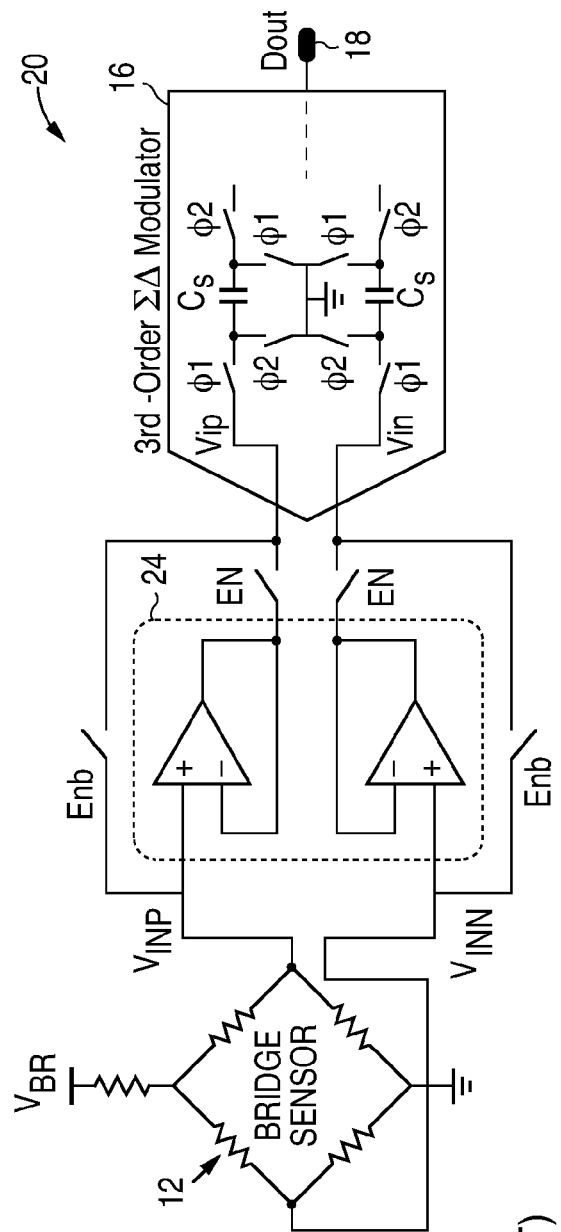
FIG. 2 is a block diagram illustrating a conventional precision sensing system using a pseudo differential buffer structure.
Figure 3:
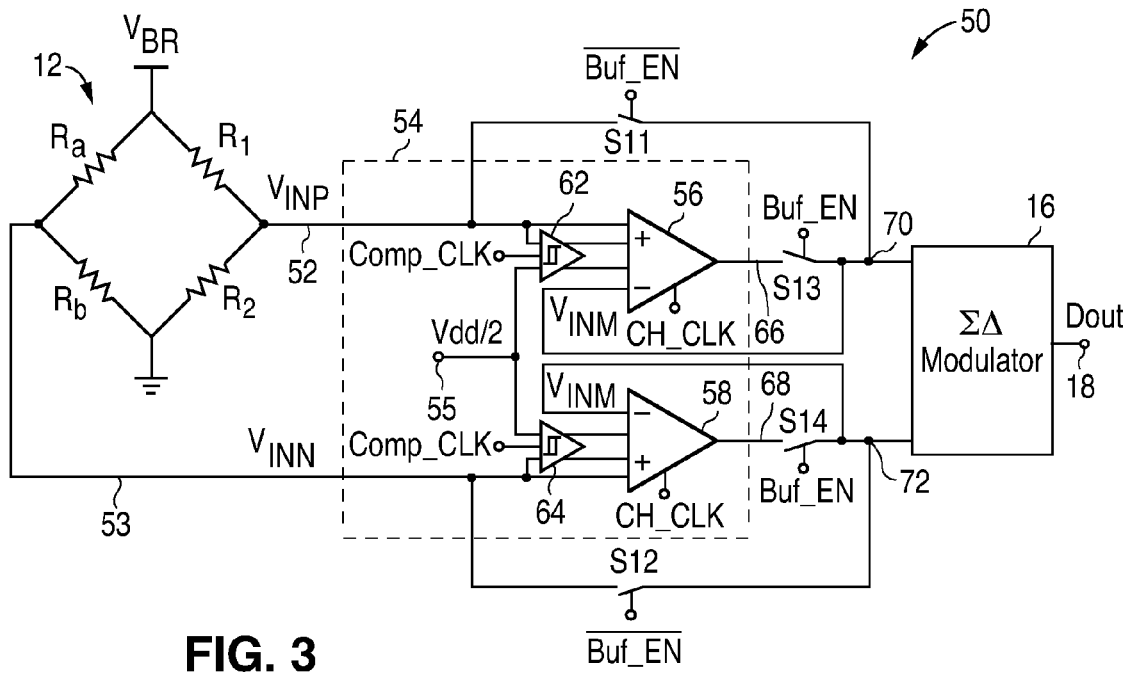
FIG. 3 is a schematic diagram of a sensing system incorporating an input buffer as an input stage to an ADC modulator according to one embodiment of the present invention.

FIG. 3 is a schematic diagram of a sensing system incorporating an input buffer as an input stage to an ADC modulator according to one embodiment of the present invention. Referring to FIG. 3, in sensing system 50, a bridge sensor 12 generates an analog input signal being a differential input signal $V_{INP}$, $V_{INN}$ on nodes 52 and 53. The differential input signal is to be digitized by a $\Sigma\Delta$ ADC which includes a $\Sigma\Delta$ modulator 16. $\Sigma\Delta$ modulator 16 receives the analog input signal and generates a digital output signal Dout (node 18) indicative of the magnitude of the analog input signal. In sensing system 50, the differential input signal $V_{INP}$, $V_{INN}$ can be provided to the $\Sigma\Delta$ modulator 16 directly, that is, unbuffered, through the bypass paths formed by switches S11 and S12. Alternately, the differential input signal $V_{INP}$, $V_{INN}$ can be provided to the $\Sigma\Delta$ modulator 16 through input buffer 54.

More specifically, switches S11 and S12 together with switches S13 and S14 configure the sensing system 50 in either the buffered mode or the unbuffered mode. Switch S11 connects the positive differential input voltage $V_{INP}$ (node 52) to a first input node 70 of the $\Sigma\Delta$ modulator 16 and switch S12 connects the negative differential input voltage $V_{INN}$ (node 53) to a second input node 72 of the $\Sigma\Delta$ modulator 16. Switches S11 and S12 are controlled by the inverse of a buffer enable signal ($\overline{Buf\_En}$). Switch S13 connects a first output node 66 of input buffer 54 to the first input node 70 of the $\Sigma\Delta$ modulator 16 while switch S14 connects a second output node 68 of input buffer 54 to the second input node 72 of the $\Sigma\Delta$ modulator 16. Switches S13 and S14 are controlled by the buffer enable signal (Buf_EN). In the bypass mode, the buffer enable signal is deasserted and the inverse of the buffer enable signal $\overline{Buf\_En}$ is asserted. Thus, switches S11 and S12 are closed to connect the differential input signal directly to the input nodes of the $\Sigma\Delta$ modulator 16. Meanwhile, switches S13 and S14 are open to disconnect input buffer 54 from the $\Sigma\Delta$ modulator 16. In the buffered mode, the buffer enable signal is asserted and the inverse of the buffer enable signal $\overline{Buf\_En}$ is deasserted. Thus, switches S11 and S12 are open to disable the bypass paths. Meanwhile, switches S13 and S14 are closed to connect input buffer 54 to the $\Sigma\Delta$ modulator 16.

The use of switches S11 to S14 for bypass and buffered mode is illustrative only. In other embodiments of the present invention, the sensing system may be implemented without the switches and the bypass paths and the input buffer is directly connected to the ADC. Incorporating the bypass mode allows the ADC to be operated in the unbuffered mode which lowers the power consumption. The switches and bypass paths in sensing system 50 are not part of the input buffer 54 and are not critical to the practice of the present invention.

Input buffer 54 receives the differential input signal $V_{INP}$ and $V_{INN}$, buffers or amplifies the differential input signal and drives the differential output signal on first and second output nodes 66, 68. Input buffer 54 is configured in a pseudo-differential mode and includes two amplifiers 56 and 58. Amplifier 56 receives the positive differential input signal $V_{INP}$ on a positive input terminal and a feedback signal $V_{INM}$ on a negative input terminal. Amplifier 58 receives the negative differential input signal $V_{INN}$ on a positive input terminal and a feedback signal $V_{INM}$ on a negative input terminal. Amplifiers 56 and 58 are each implemented using a pair of complementary differential input stages. Amplifiers 56 and 58 receive select signals from respective hysteretic comparators 62, 64 to select the desired input stages to use depending on the analog signal level. In operation, only one input stage is enabled at a time and the complementary differential input stages are not turned on at the same time. In the present embodiment, hysteretic comparators 62, 64 compare the differential input signal $V_{INP}$, $V_{INN}$ to a voltage which is half of the positive power supply voltage Vdd/2 (node 55) in the present embodiment. Hysteretic comparators 62, 64 has a comparison threshold with hysteresis so that when the input signal Vin is slowly varying or has small amounts of superimposed noise, the slowly varying or low noise signal would not cause unwanted output state transitions. Hysteretic comparators 62, 64 are clocked comparators receiving a comparator clock signal (Comp_CLK) to generate the select signals for the respective amplifier 56, 58. In high-precision, low-frequency operations, the comparator clock signal operates at a sufficient speed to generate the select signals required to select the desired differential input stage without degrading the performance of the system.

In FIG. 3, amplifiers 56 and 58 are shown as receiving a chopping clock signal CH_CLK. The chopping clock signal CH_CLK, which may be a single clock signal or multiple clock signals, is used to control chopping circuits in the amplifiers where applicable. As will be described in more detail below, chopping techniques can be applied to the amplifiers to reduce errors. The use of chopping circuits in the amplifiers is optional and may be omitted in some embodiments of the present invention. In that case, the chopping clock signal CH_CLK may also be omitted in the amplifiers of FIG. 3.

Figure 4:
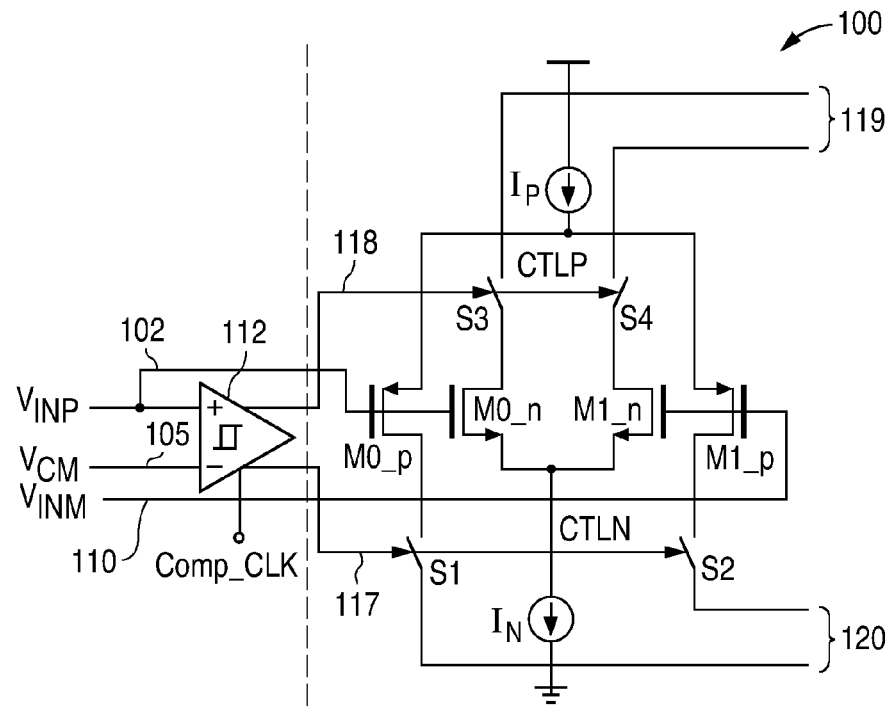
FIG. 4 is a circuit diagram illustrating the hysteretic comparator and the input stage of an amplifier in the input buffer of FIG. 3 according to one embodiment of the present invention.

FIG. 4 is a circuit diagram illustrating the hysteretic comparator and the input stage of an amplifier in the input buffer of FIG. 3 according to one embodiment of the present invention. The input stage of the amplifier circuit shown in FIG. 4 and the associated hysteretic comparator can be any one of the two amplifier circuits 56, 58 in the input buffer 54. The input stage and the hysteretic comparator are coupled to receive either the positive or the negative differential input signal ($V_{INP}$ or $V_{INN}$) and a feedback signal $V_{INM}$. In FIG. 4 and subsequent figures, the amplifier circuit is assumed to be amplifier 56 of input buffer 54 where the input stage and the hysteretic comparator receive the positive differential input signal ($V_{INP}$). The description of FIG. 4 and subsequent figures is applicable to the amplifier 58 of input buffer 54 receiving the negative differential input signal ($V_{INN}$).

Referring to FIG. 4, an input stage 100 of an amplifier circuit in the input buffer 54 (FIG. 3) includes two complementary differential input stages. The first differential input stage is formed by a p-type differential pair including PMOS transistors M0_p and M1_p and supplied by a tail current $I_P$. The second differential input stage is formed by an n-type differential pair including NMOS transistors M0_n and M1_n supplied by a tail current $I_N$. PMOS transistors M0_p and M1_p are switchably connected to a first pair of differential output nodes 120 through switches S1 and S2. NMOS transistors M0_n and M1_n are switchably connected to a second pair of differential output nodes 119 through switches S3 and S4. Switches S1-S4 are controlled by select signals generated by a hysteretic comparator 112.

Each differential input stage receives the positive differential input signal $V_{INP}$ and the feedback signal $V_{INM}$. That is, the positive differential input signal $V_{INP}$ is coupled to PMOS transistor M0_p in the first differential input stage and to NMOS transistor M0_n in the second differential input stage. The feedback signal $V_{INM}$ is coupled to PMOS transistor M1_p in the first differential input stage and to NMOS transistor M1_n in the second differential input stage. The hysteretic comparator 112 receives the positive differential input signal $V_{INP}$ and a voltage $V_{CM}$ which is half of the positive power supply in one embodiment. The hysteretic comparator 112 compares the voltage $V_{INP}$ to the voltage $V_{CM}$ and generates a pair of select signals CTLN and CTLP, on nodes 117 and 118 respectively. Select signals CTLN and CTLP are generated based on the voltage level of the differential input signal. In operation, when the differential input signal is less than the voltage $V_{CM}$, the first differential input stage of PMOS transistors is selected. When the differential input signal is greater than the voltage $V_{CM}$, the second differential input stage of NMOS transistors is selected. The hysteretic comparator 112 operates under the control of a comparator clock signal Comp_CLK to generate the select signals synchronized to the clock edges of the clock signal.

More specifically, when the differential input signal $V_{INP}$ is less than the common mode voltage $V_{CM}$, the hysteretic comparator 112 asserts select signal CTLN to close switches S1 and S2 and deasserts select signal CTLP to open switches S3 and S4 to select the first differential input stage of PMOS transistors. On the other hand, when the differential input signal $V_{INP}$ is greater than the voltage $V_{CM}$, the hysteretic comparator 112 asserts select signal CTLP to close switches S3 and S4 and deasserts select signal CTLN to open switches S1 and S2 to select the second differential input stage of NMOS transistors. The hysteresis in the comparator 112 ensures that at any time, only one of the differential input stages is selected and connected to the respective differential output nodes. The hysteretic comparator 112 ensures that the first and second differential input stages would not turn on at the same time to compromise the CMRR and PSRR of the input buffer.

Figure 5:
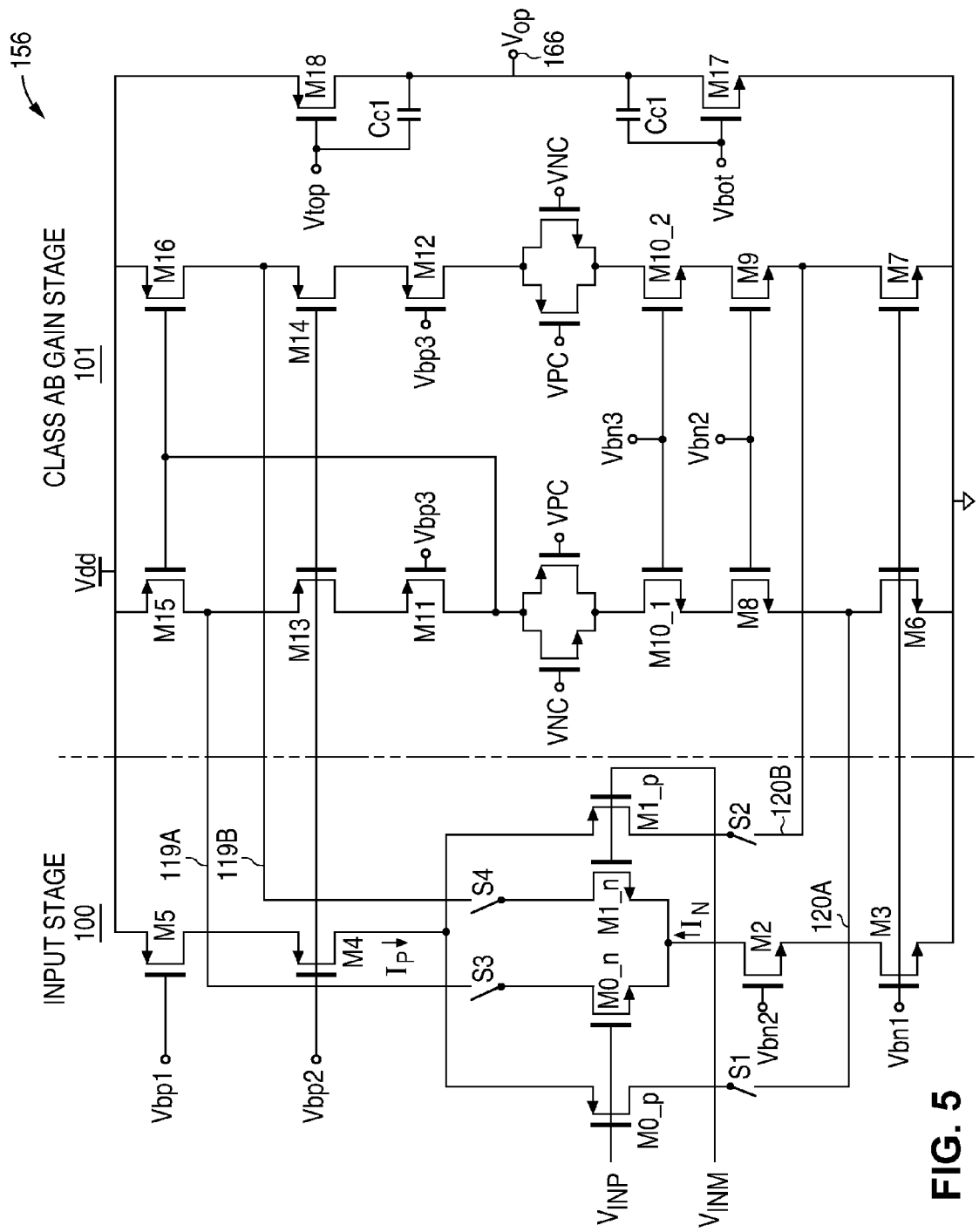
FIG. 5 is a circuit diagram of an amplifier circuit according to one embodiment of the present invention.

FIG. 5 is a circuit diagram of an amplifier circuit according to one embodiment of the present invention. The amplifier circuit of FIG. 5 can be used to implement the amplifier circuits in the input buffer of FIG. 3. Referring to FIG. 5, in the present embodiment, the amplifier circuit 156 is implemented as a two-stage folded triple cascode operational amplifier (op-amp) and includes an input stage 100 followed by a gain stage 101.

When a buffer is used to drive a switched-capacitor ADC, it is desirable for the buffer to have a high open loop gain and sufficient bandwidth in order to avoid gain errors. More specifically, in operation, the switched-capacitor ADC draws a small transient of input current at the end of each input sample when the internal sampling capacitors switch back to the input nodes for acquisition of the next sample. To avoid errors, the buffer must recover from this current transient and settle before the next sampling starts. Thus, the buffer needs to have a high open loop gain and sufficient bandwidth. For instance, for a 21-bit resolution ADC, a loop gain of about 112 dB and a bandwidth of about 0.8 MHz are desirable for 220 Khz conversion speed. High loop gain and large bandwidth ensure that the buffer may settle from a load transient in less than the ADC's acquisition time. By using the two-stage folded triple cascode op-amp structure for the amplifier circuits in the input buffer of the present invention, the input buffer can achieve a high open loop gain as well as a large bandwidth with proper compensation. In one embodiment, an input buffer constructed using the amplifier circuit of the present invention can achieve a loop gain of 140 dB and a bandwidth of 1.3 MHz for a 21-bit resolution ADC.

The input stage 100 of the amplifier circuit 156 is constructed in the same manner as described above with reference to FIG. 4 and includes two complementary differential input stage to support rail-to-rail input and output common mode voltage range. In FIG. 5, the tail current $I_N$ for the NMOS differential pair M0_n and M1_n is supplied by an NMOS transistor M2 biased by a gate voltage Vbn2 and an NMOS transistor M3 biased by a gate voltage Vbn1, transistors M2 and M3 being connected in series. The tail current $I_p$ for the PMOS differential pair M0_p and M1_p is supplied by a PMOS transistor M4 biased by a gate voltage Vbp2 and a PMOS transistor M5 biased by a gate voltage Vbp1, transistors M4 and M5 being connected in series.

In input stage 100, switches S1-S4, under the control of the hysteretic comparator, operate to select one of the two differential input stages based on the input voltage level. More specifically, when the input voltage approaches the lower power supply rail (e.g. Vss or ground), the first differential input stage of PMOS transistors is selected. When the input voltage approaches the upper power supply rail (e.g. Vdd), the second differential input stage of NMOS transistor is selected. The hysteretic comparator associated with the amplifier circuit determines the voltage level at which one differential input stage hands off to another differential input stage. In this manner, the two complementary differential input stages work in conjunction to receive analog input signals that span the entire supply voltage range.

A key feature of the amplifier circuit 156 is that the two differential input stages are not turned on at the same time. When the two differential input stages are allowed to overlap, i.e. turn on at the same time, the amplifier circuit can suffer from poor CMRR and PSRR. Also, the overlapping region of the two differential input stages leads to variation in the transconductance of the input stage, which in turn translates to increased power for retaining a stable frequency response. The amplifier circuit 156 of the present invention overcomes the deficiencies of conventional dual input stage amplifier circuits by avoiding any overlap between the NMOS input stage and the PMOS input stage. The amplifier circuit 156 includes dual differential input stages to support rail-to-rail input voltage range but operates as if the amplifier circuit has only a single differential input stage so that high PSRR and CMRR characteristics are maintained.

In amplifier circuit 156, the gain stage 101 is implemented as a class AB gain stage which supports high output common mode range and realize good driving capability. The gain stage 101 generates the amplifier output signal VOP on an output node 166. The class AB gain stage does not have slewing limitation and thus reduces nonlinearity. The first pair of differential output nodes 120A and 120B are coupled to the source terminals of NMOS transistors M8 and M9 in gain stage 101. The second pair of differential output nodes 119A and 119B are coupled to the source terminals of PMOS transistors M13 and M14. The amplifier circuit 156 with the class AB gain stage realizes high open loop gain and large bandwidth of operation.

Figure 6:
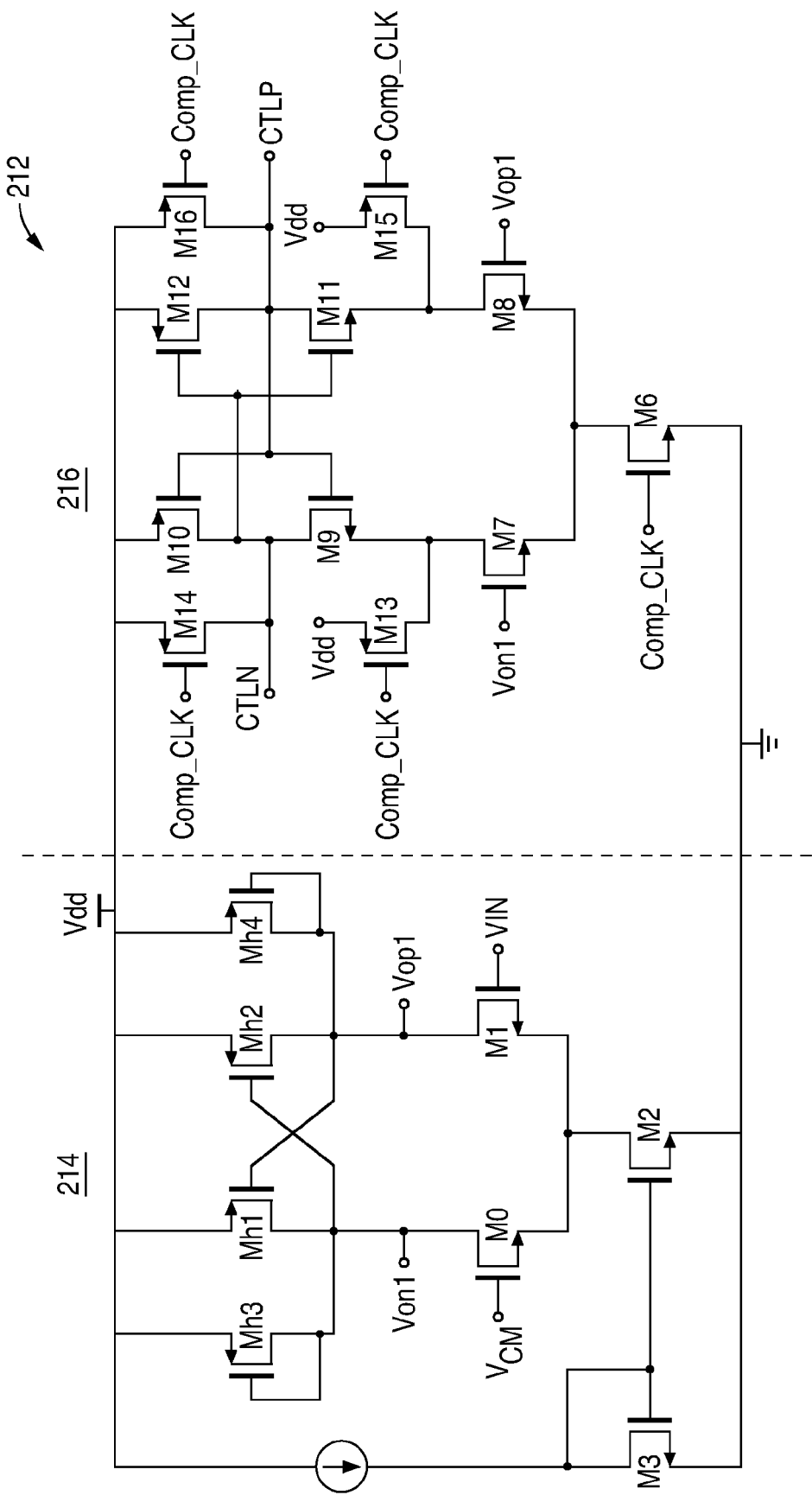
FIG. 6 illustrates a hysteretic comparator circuit which can be incorporated in the input buffer of FIG. 3 according to one embodiment of the present invention.

FIG. 6 illustrates a hysteretic comparator circuit which can be incorporated in the input buffer of FIG. 3 according to one embodiment of the present invention. Referring to FIG. 6, a hysteretic comparator 212 is implemented as a positive edge triggered low power clocked comparator. The hysteretic comparator 212 includes a pre-amplifier stage 214 followed by a dynamic latch stage 216. The pre-amplifier stage 214 increases the resolution and reduce kickback noise. Hysteresis is introduced to avoid the unwanted multiple output transitions on the select signals CTLP and CTLN when the input signal Vin is slowly varying or has small amounts of superimposed noise. In one embodiment, the hysteretic comparator circuit has a rising trigger level of voltage $V_{CM}$+50 mv and a falling trigger level of voltage $V_{CM}$-50 mv.

In the present embodiment, the comparator clock signal Comp_CLK is the inverse of the sampling clock for the ADC modulator. Therefore, during the modulator sampling phase, the comparator will decide which differential input stage to select for the next sample. When the input voltage $V_{IN}$ (which can be $V_{INP}$ or $V_{INN}$) is greater than the common mode voltage $V_{CM}$, then NMOS differential input stage is selected. Alternately, when the input voltage is less than the common mode voltage $V_{CM}$, the PMOS differential input stage is selected.

Figure 7:
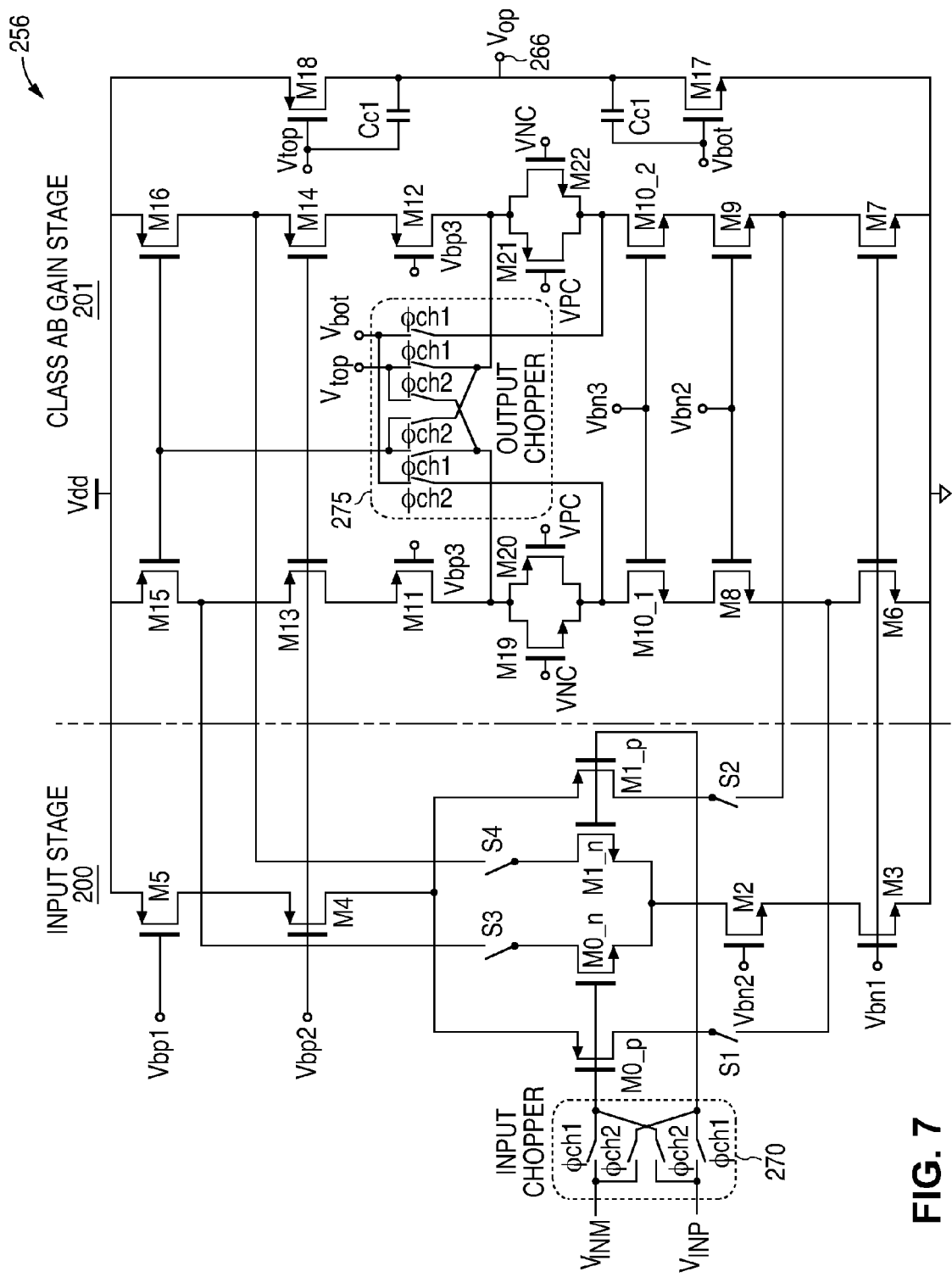
FIG. 7 is a circuit diagram of an amplifier circuit incorporating chopping techniques according to one embodiment of the present invention.

FIG. 7 is a circuit diagram of an amplifier circuit incorporating chopping techniques according to one embodiment of the present invention. When the input buffer is coupled to drive an ADC, an ideal level of buffer noise is to have the signal-to-noise ratio (SNR) of the buffer be better than the theoretical limit of the ADC. In high precision and low frequency applications, chopping technique can be used to achieve low buffer noise. Chopping refers to modulating the DC input signal to create an AC signal and then synchronously demodulating the output signal to restore the DC value. In this manner, all static DC errors of the components used can be eliminated.

Referring to FIG. 7, an amplifier circuit 256 is constructed in the same manner as the amplifier circuit 156 of FIG. 5 with the addition of an input chopper circuit 270 and an output chopper circuit 275. In operation, the PMOS differential input stage (PMOS transistors M0_p and M1_p) has a different offset than the NMOS differential input stage (NMOS transistors M0_n and M1_n) and the offsets are of opposing polarity. During the hand-off between one differential input stage to another differential input stage, the offset voltage is the average of the offset from each input stage. Hence, the rail-to-rail input range results in variations in the offset voltage. In sensitive high precision application, variations in the offset voltage can jeopardize the accuracy of the system.

According to embodiments of the present invention, chopping is used to achieve a rail-to-rail input range without the crossover distortion in the offset voltage that occurs during the hand-off region of the dual differential input stages. In other words, chopping is used in the amplifier circuit to modulate the 1/f noise and offset to high frequency. When the amplifier circuit 256 incorporates chopping, the amplifier circuit can achieve excellent low offset voltages and very low noise. An input buffer thus constructed is suitable for demanding applications, such as transducers used in high resolution scales and measurements.

In amplifier circuit 256, the input chopper circuit 270 and the output chopper circuit 275 are driven by clock signals φch1 and φch2. Clock signals φch1 and φch2 are non-overlapping complementary clock signals. That is, one clock signal is high while the other clock signal is low without overlapping. Input chopper circuit 270 is coupled to the input stage 200 of the amplifier circuit 256 to modulate the input signals provided to the dual differential input stages. The output chopper circuit 275 is coupled to the gain stage 201 of the amplifier circuit 256 to swap the diode connection and class AB biasing points.

More specifically, at the input chopper circuit 270, when clock signal φch1 is high, the input signal $V_{INM}$ is connected to transistors M0_p and M0_n while the input signal $V_{INP}$ is connected to transistors M1_p and M1_n. Alternately, when clock signal φch2 is high, the input signal $V_{INM}$ is connected to transistors M1_p and M1_n while the input signal $V_{INP}$ is connected to transistors M0_p and M0_n. In this manner, the input chopper circuit 270 connects the two input signals alternately to the input transistors of the dual differential input pairs.

At the output chopper circuit 275, when clock signal φch1 is high, transistors M11, M13 and M15 are arranged as diode load by connecting the gate terminal of transistor M15 to the drain terminal of transistor M11. Also, the gate terminal of transistor M18 (voltage Vtop) is connected to the drain terminal of transistor M12. The gate terminal of transistor M17 (voltage Vbot) is connected to the drain terminal of transistor M10_2 drain for forming the class AB biasing. Alternately, when clock signal φch2 is high, transistors M12, M14 and M16 are arranged as diode load by connecting the gate terminal of transistor M16 to the drain terminal of transistor M12. Also, the gate terminal of transistor M18 (voltage Vtop) is connected to the drain terminal of transistor M11. The gate terminal of transistor M17 (voltage Vbot) is connected to the drain terminal of transistor M10_1 drain for forming the class AB biasing. In one embodiment, a chopping frequency of 50 KHz is used as the amplifier circuit 1/f noise corner frequency is at 20 KHz. By using the input and output chopper circuits, the second stage offset contribution to the overall buffer error is reduced and compensation capacitor further helps in filtering out the residual offset.

Figure 8:
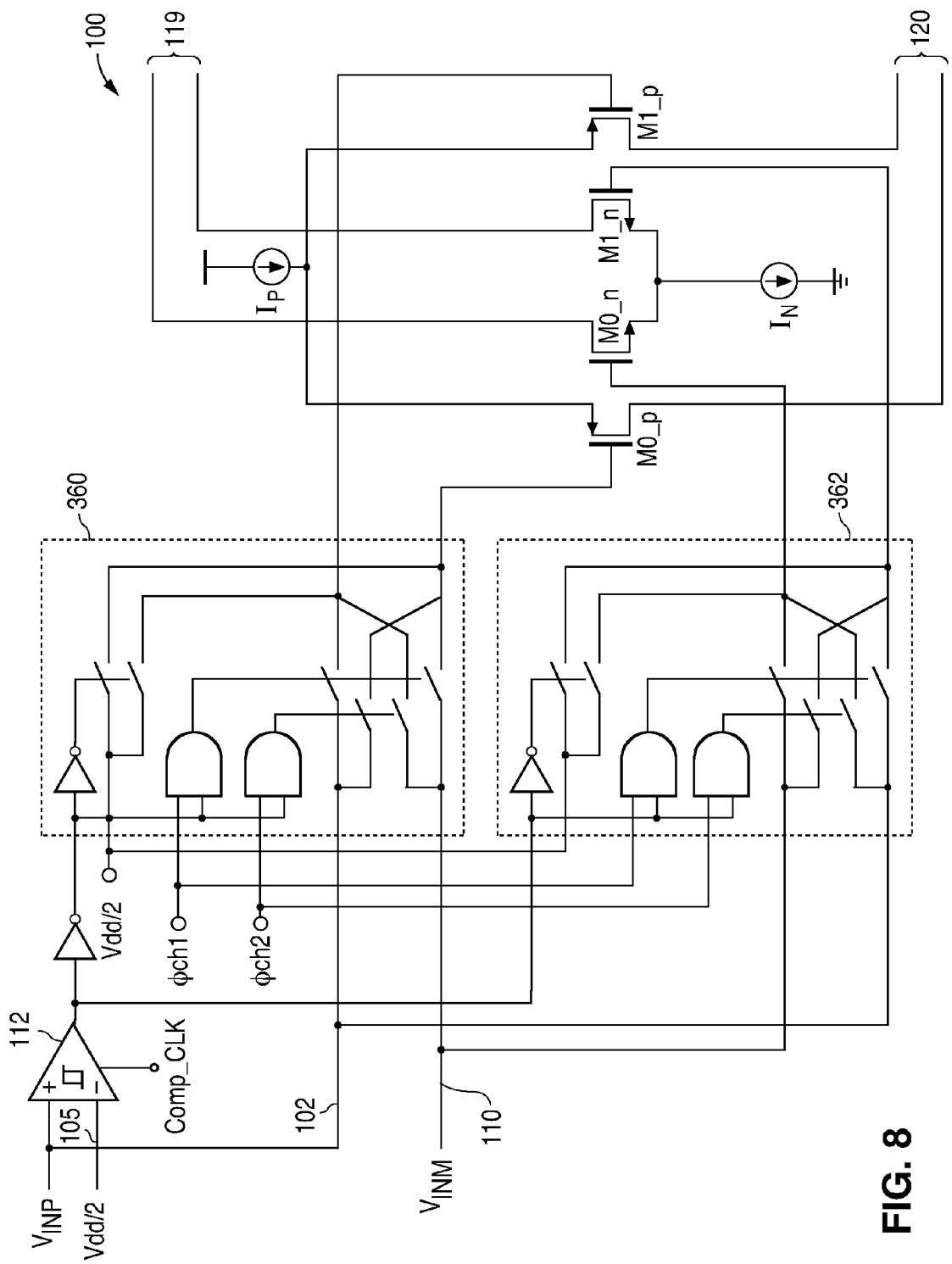
FIG. 8 is a circuit diagram illustrating the hysteretic comparator and the input stage of an amplifier in the input buffer incorporating two input chopper circuits according to one embodiment of the present invention.

FIG. 8 is a circuit diagram illustrating the hysteretic comparator and the input stage of an amplifier in the input buffer incorporating two input chopper circuits according to one embodiment of the present invention. The two input chopper circuits are provided to implement chopping for the n-type differential pair and the p-type differential pair of the amplifier input stage separately. Referring to FIG. 8, a pair of input chopper circuits 360 and 362 are coupled to the input stage 100 of an amplifier circuit to modulate the input signals provided to the dual differential input stages. The input chopper circuits 360 and 362 are controlled by the select signals generated by the hysteretic comparator 112 which operates to select or turn on either the input chopper circuit 360 for the p-type differential pair or the input chopper circuit 362 for the n-type differential pair. The input chopper circuits 360 and 362 are also driven by clock signals φch1 and φch2. Clock signals φch1 and φch2 are non-overlapping complementary clock signals.

More specifically, in a given fabrication process, the output impedance (the drain-to-source resistance $R_{DS}$) of an NMOS transistor and a PMOS transistor are very different from each other. Accordingly, using separate input chopper circuits for the n-type and p-type differential pair provides benefits in that the electrical characteristics, including gain and bandwidth, of the amplifier can be maintained in all the three regions of operation.

In operation, when the input signal $V_{INP}$ is less than Vdd/2, the input chopper circuit 360 is selected and p-type differential pair M0_p and M1_p is enabled to process the input signal. The input chopper circuit 362 is not selected and the n-type differential pair M0_n and M1_n are biased to a voltage Vdd/2. Since n-type differential pair is not in the signal path, the electrical characteristics of the input stage remain the same. On the other hand, when the input signal $V_{INP}$ is equal to or greater than Vdd/2, the input chopper circuit 362 is selected and the n-type differential pair M0_n and M1_n is enabled to process the input signal. The input chopper circuit 360 is not selected and the p-type differential pair M0_p and M1_p are biased to a voltage Vdd/2. Since p-type differential pair is not in the signal path, the electrical characteristics of the input stage remain the same.

FIG. 8 illustrates the pair of input chopper circuits incorporated in an input stage 100 for an amplifier for processing the positive differential input signal $V_{INP}$. It is understood that the input chopper circuits can be incorporated in an input stage for an amplifier for processing the negative differential input signal $V_{INN}$. The incorporation of the input chopper circuits in the amplifier circuit for input signal $V_{INN}$ is the same as that for $V_{INP}$ and will not be further described.

When the input buffer of FIG. 3 is constructed using the amplifier circuit of FIG. 5 or the amplifier circuit of FIG. 7 with chopping, a rail-to-rail buffer with low noise, high CMRR and PSRR characteristics can be realized. In one embodiment, the input buffer can operate over the rail-to-rail input range with a maximum error from either of the differential input stage to be within +/−1.1 μV which is well below the expected resolution of the ADC.

For applications where the input buffer is coupled as an input stage to drive an ADC, the noise free resolution of the input buffer is evaluated with AC input signals. Simulation results show that the performance of the ADC is not affected or degraded with the addition of the input buffer as an input stage. Furthermore, when chopping techniques are applied, a large improvement (on the order of 1000 times) in residual offset error can be obtained.

The above detailed descriptions are provided to illustrate specific embodiments of the present invention and are not intended to be limiting. Numerous modifications and variations within the scope of the present invention are possible. The present invention is defined by the appended claims.

We claim:

1. A circuit, comprising:
    a first amplifier circuit coupled to receive a first part of a differential input signal and a first feedback signal and to generate a first part of a differential output signal being the first feedback signal;
    a first comparator coupled to compare the first part of the differential input signal and a first voltage and to generate a first pair of select signals, the comparator having a comparison threshold with hysteresis;
    a second amplifier circuit coupled to receive a second part of the differential input signal and a second feedback signal and to generate a second part of the differential output signal being the second feedback signal;
    a second comparator coupled to compare the second part of the differential input signal and the first voltage, the comparator having a comparison threshold with hysteresis,
    wherein each of the first and second amplifier circuits comprises first and second complementary differential input stages, each of the first and second complementary differential input stages being configured to receive the respective first or second part of the differential input signal and the respective first or second feedback signal, and
    wherein the first and second comparators generate respective first and second pairs of select signals to turn on only one of the first or the second differential input stage in each amplifier circuit depending on a value of the respective part of the differential input signal, the first and second complementary differential input stages of each amplifier circuit not being turned on at the same time.

2. The circuit of claim 1, wherein in each of the first and second amplifier circuits:
    the first differential input stage comprises first and second PMOS transistors having their source terminals connected together to a first node receiving a first tail current, their gate terminals coupled to receive the respective part of the differential input signal and the respective feedback signal, and their drain terminals coupled to a first pair of switches, the switches being controlled by a first select signal of the pair of select signals generated by the respective comparator to activate or deactivate the first differential input stage; and
    the second differential input stage comprises first and second NMOS transistors having their source terminals connected together to a second node receiving a second tail current, their gate terminals coupled to receive the respective part of the differential input signal and the respective feedback signal, and their drain terminals coupled to a second pair of switches, the switches being controlled by a second select signal of the pair of select signals generated by the respective comparator to activate or deactivate the second differential input stage.

3. The circuit of claim 2, wherein each of the first and second amplifier circuits further comprises a gain stage for receiving an intermediate differential output signal from the first or second differential input stage and generating the differential output signal of the respective amplifier circuit.

4. The circuit of claim 1, wherein each of the first and second comparators receives a first clock signal, the respective comparator circuit being configured to generate the pair of select signal clocked by the first clock signal.

5. The circuit of claim 3, wherein each of the first and second amplifier circuits further comprises a first chopper circuit coupled to the first and second complementary differential input stage to modulate the respective part of the differential input signal and the respective feedback signal and a second chopper circuit coupled to the gain stage to modulate a diode connection and a biasing point of the gain stage, the first and second chopper circuit being controlled by a pair of non-overlapping clock signals.

6. The circuit of claim 2, wherein when the respective part of the differential input signal is less than the first voltage, the respective comparator generates the respective pair of select signals to activate the first differential input stage comprising first and second PMOS transistors and to deactivate the second differential input stage comprising first and second NMOS transistors.

7. The circuit of claim 6, wherein the pair of select signals is operative to close the first pair of switches to activate the first differential input stage and to open the second pair of switches to deactivate the second differential input stage.

8. The circuit of claim 2, wherein when the respective part of the differential input signal is greater than the first voltage, the respective comparator generates the respective pairs of select signals to deactivate the first differential input stage comprising first and second PMOS transistors and to activate the second differential input stage comprising first and second NMOS transistors.

9. The circuit of claim 8, wherein the pair of select signals is operative to open the first pair of switches to deactivate the first differential input stage and to close the second pair of switches to activate the second differential input stage.

10. The circuit of claim 1, wherein the first voltage comprises half of a positive power supply voltage.

11. The circuit of claim 1, wherein each of the first and second amplifier circuits further comprises a first input chopper circuit coupled to the first differential input stage and a second input chopper circuit coupled to the second differential input stage, the respective comparator generating respective select signals to turn on only one of the first and second input chopper circuits to process the respective part of the differential input signal, the selected input chopper circuit operative to modulate the respective part of the differential input signal and the respective feedback signal, the first and second input chopper circuits further being controlled by a pair of non-overlapping clock signals.

12. The circuit of claim 1, further comprising:
a modulator coupled to receive the first part of the differential output signal from first amplifier, and the second part of the differential output signal from the second amplifier;
the modulator generating a digital output signal representative of the differential output signal.

13. A circuit, comprising:
first and second amplifiers receiving a differential input signal formed by a first input signal and a second input signal, and generating a differential output signal formed by a first output signal and a second output signal;
the first amplifier receiving the first input signal and a first feedback signal and generating the first output signal, which corresponds to the first feedback signal;
a first comparator coupled to compare the first input and a first voltage and to generate a first pair of select signals;
the second amplifier receiving the second input signal and a second feedback signal and generating the second output signal, which corresponds to the second feedback signal;
a second comparator coupled to compare the second input signal and the first voltage,
wherein each of the first and second amplifiers comprises first and second complementary differential input stages, each of the first and second complementary differential input stages being configured to receive the respective first or second input signal and the respective first or second feedback signal, and
wherein the first and second comparators generate respective first and second pairs of select signals to activate only one of the first or the second differential input stage in each amplifier depending on a value of the respective first or second input signal, the first and second complementary differential input stages of each amplifier not being activated at the same time.

14. The circuit of claim 13, wherein, in each of the first and second amplifiers:
the first differential input stage comprises first and second PMOS transistors having their source terminals connected together to a first node receiving a first tail current, their gate terminals coupled to receive the respective first or second input signal and the respective feedback signal, and their drain terminals coupled to a first pair of switches, the switches being controlled by a first select signal of the pair of select signals generated by the respective comparator to activate or deactivate the first differential input stage; and
the second differential input stage comprises first and second NMOS transistors having their source terminals connected together to a second node receiving a second tail current, their gate terminals coupled to receive the respective first or second input signal and the respective feedback signal, and their drain terminals coupled to a second pair of switches, the switches being controlled by a second select signal of the pair of select signals generated by the respective comparator to activate or deactivate the second differential input stage.

15. The circuit of claim 14, wherein each of the first and second amplifiers further comprises a gain stage for receiving an intermediate differential output signal from the first or second differential input stage and generating the differential output signal of the respective amplifier.

16. The circuit of claim 13, wherein each of the first and second comparators each has a comparison threshold with hysteresis.

17. The circuit of claim 13, wherein each of the first and second comparators receives a first clock signal, the respective comparator circuit being configured to generate the pair of select signal clocked by the first clock signal.

18. The circuit of claim 15, wherein each of the first and second amplifiers further comprises a first chopper circuit coupled to the first and second complementary differential input stage to modulate the respective first or second input signal and the respective feedback signal and a second chopper circuit coupled to the gain stage to modulate a diode connection and a biasing point of the gain stage, the first and second chopper circuit being controlled by a pair of non-overlapping clock signals.

19. The circuit of claim 14, wherein when the respective first or second input signal is less than the first voltage, the respective comparator generates the respective pair of select signals to activate the first differential input stage comprising first and second PMOS transistors and to deactivate the second differential input stage comprising first and second NMOS transistors.

20. The circuit of claim 19, wherein the pair of select signals is operative to close the first pair of switches to activate the first differential input stage and to open the second pair of switches to deactivate the second differential input stage.

21. The circuit of claim 14, wherein when the respective first or second input signal is greater than the first voltage, the respective comparator generates the respective pairs of select signals to deactivate the first differential input stage comprising first and second PMOS transistors and to activate the second differential input stage comprising first and second NMOS transistors.

22. The circuit of claim 21, wherein the pair of select signals is operative to open the first pair of switches to deactivate the first differential input stage and to close the second pair of switches to activate the second differential input stage.

23. The circuit of claim 13, wherein the first voltage comprises half of a positive power supply voltage.

24. The circuit of claim 13, wherein each of the first and second amplifier circuits further comprises a first input chopper circuit coupled to the first differential input stage and a second input chopper circuit coupled to the second differential input stage, the respective comparator generating respective select signals to turn on only one of the first and second input chopper circuits to process the respective part of the differential input signal, the selected input chopper circuit operative to modulate the respective part of the differential input signal and the respective feedback signal, the first and second input chopper circuits further being controlled by a pair of non-overlapping clock signals.

25. The circuit of claim 13, further comprising:
a modulator coupled to receive the first output signal from first amplifier, and the second output signal from the second amplifier;
the modulator generating a digital output signal representative of the differential output signal.

* * * * *